United States Patent
Wang

(10) Patent No.: US 7,889,016 B2
(45) Date of Patent: Feb. 15, 2011

(54) INTEGRATED RC OSCILLATOR WITH HIGH FREQUENCY STABILITY, NOTABLY FOR AN INTEGRATED SWITCHED-MODE POWER SUPPLY

(75) Inventor: Zhenhua Wang, Zurich (CH)

(73) Assignee: ST-Ericsson SA, Plan-les-Ouates (CH)

( * ) Notice: Subject to any disclaimer, the term of this patent is extended or adjusted under 35 U.S.C. 154(b) by 247 days.

(21) Appl. No.: 12/064,382

(22) PCT Filed: Aug. 3, 2006

(86) PCT No.: PCT/IB2006/052683
§ 371 (c)(1),
(2), (4) Date: Aug. 12, 2008

(87) PCT Pub. No.: WO2007/023402
PCT Pub. Date: Mar. 1, 2007

(65) Prior Publication Data
US 2009/0115539 A1 May 7, 2009

(30) Foreign Application Priority Data
Aug. 24, 2005 (EP) ............................ 05300693

(51) Int. Cl.
*H03K 3/26* (2006.01)
(52) U.S. Cl. ............ 331/111; 331/143; 331/176; 327/182; 327/131
(58) Field of Classification Search .......... 331/176, 331/111, 143; 327/182, 131
See application file for complete search history.

(56) References Cited

U.S. PATENT DOCUMENTS

| 5,889,441 | A | 3/1999 | Inn |
| 6,204,694 | B1 | 3/2001 | Sunter |
| 7,642,872 | B2 * | 1/2010 | Fort et al. .............. 331/111 |

FOREIGN PATENT DOCUMENTS

| JP | 54000848 A | 1/1979 |
| JP | 57087619 A | 6/1982 |
| JP | 04340805 A | 11/1992 |
| JP | 05110419 A | 4/1993 |
| JP | 07176995 A | 7/1995 |
| WO | 2004055968 A2 | 7/2004 |

* cited by examiner

*Primary Examiner*—Arnold Kinkead
(74) *Attorney, Agent, or Firm*—Robert Iannucci; Seed IP Law Group PLLC

(57) ABSTRACT

An integrated oscillator (10), for an integrated circuit, comprises i) first (CI1) and second (CI2) compensated inverters mounted in series and each comprising first (PI11;PI21) and second (PI12;PI22) plain inverters mounted in parallel and comprising transistors having channel lengths respectively shorter and longer than an optimal channel length, the first compensated inverter (CI1) having input and output terminals respectively connected to first (N1) and second (N2) nodes and the second compensated inverter (CI2) having input and output terminals respectively connected to the second node (N2) and to a third node (N3), ii) a resistor (R) having a chosen resistance value and comprising first and second terminals connected respectively to the first (N1) and second (N2) nodes, and iii) a capacitor (C) comprising first and second terminals connected respectively to the first (N1) and third (N3) nodes, and having a chosen capacitance value to charge and discharge oneself in order to periodically deliver a clock signal at the desired oscillation frequency.

16 Claims, 2 Drawing Sheets

US 7,889,016 B2

Figure 1:
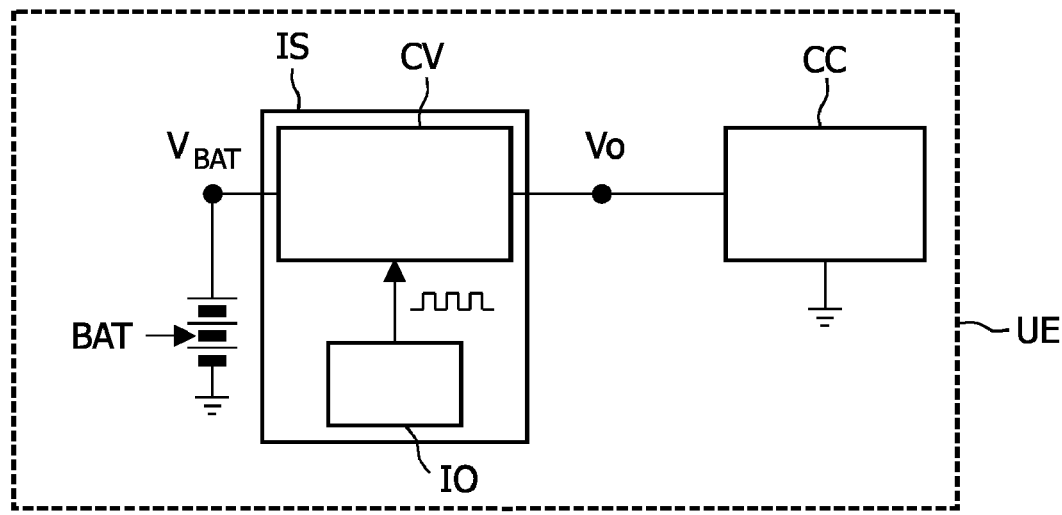

INTEGRATED RC OSCILLATOR WITH HIGH FREQUENCY STABILITY, NOTABLY FOR AN INTEGRATED SWITCHED-MODE POWER SUPPLY

The present invention relates to the domain of integrated circuits, and more precisely to oscillators which can be used in many integrated circuits.

As it is known by one skilled in the art it is sometimes important to have at one's disposal periodical clock signals with high frequency stability. This is notably the case of switched-mode power supplies (or SMPSs) that are liable to be used into "small" electronic equipments, such as mobile or cellular phones, cordless phones, digital still cameras, MP3 players, or personal digital assistant (PDA), for instance.

Today's state-of-the-art small electronic equipments provide a lot of functionalities (or features) which require extra processing power, whilst the equipment size decreases living less and less room, especially for the battery. For instance, some mobile phones allow web browsing, wireless transfer of e-mails, digital photography and even video streaming. In the same time, the equipment users want batteries to be able to supply efficiently their equipments for hours, and go for weeks between charges when they are in stand-by mode.

As it is known by the man skilled in the art, the key to long battery life is the power management. Most integrated circuits (ICs) inside a small equipment run at lower or higher supply voltage than the equipment battery. Therefore, the battery voltage has to be scaled properly to the required supply voltage of each IC, by using a power conversion regulator circuit, such as a switched-mode power supply (or SMPS).

Power efficiency of SMPS is an important issue because the higher power efficiency the longer the equipment working time and stand-by time without recharging the battery. Moreover, higher power efficiency also means more stable temperature for the ICs within a small equipment, which is good both for equipment maker and user. When the SMPS power-conversion efficiency is low, the SMPS power regulator lost power during the energy transfer process, which generates heat. This heat reduces the battery life and degrades the reliability of the small equipment. The power efficiency of a power regulator, such as a switching DC-DC converter, is relatively independent of battery voltage and output current. However, the power efficiency of a power regulator decreases with increase of the switching frequency.

Moreover, because of the switching nature of a SMPS, it generates harmonic noises, especially when the switching frequency of the switching power regulator is not stable enough, which can interfere with analog, mixed-signal, and RF circuits contained in a small equipment. Two types of harmonic interferences may be generated, one through the supply voltage (Vo) and the other through a capacitive or magnetic direct coupling from the large-amplitude clock signals, generated by the oscillator feeding the DC-DC converter, to the circuit to power (the coupling can also happen via a common substrate, which is the case if the DC-DC converter is on-chip, embedded with the circuit it powers).

More precisely, due to its switching nature any SMPS delivers an output DC voltage superpositioned with a ripple voltage. As a result, the output of SMPS contains components of the switching frequency and the sidebands and harmonics thereof. For instance, in a step-down DC-DC converter harmonics are large and may cause potential interference issues in a cellular equipment, because receiver front-end, analog and mixed-signal circuits (such as baseband and audio interface) are sensitive to any change in supply voltage. Therefore, the equipment performances may be affected by the output ripple of the switching DC-DC converter. To reduce these interferences, the power supply rejection ratio of the equipment needs to be high.

Any capacitive, magnetic or substrate coupling of a large amplitude signal, such as a periodical clock signal outputted by an oscillator, to a circuit or system is liable to degrade its performances, especially when sensitive nodes of the circuit (like RF front-end or microphone inputs) pick up the interferences and amplify them with large gains. The traditional method for preventing this kind of coupling consists in isolating the noise-generating circuits from each noise-sensitive circuit or system. However, in a small equipment everything is so densely packed that this traditional method is no longer possible (shielding is not practical for cost and size reasons).

More, above a critical frequency the efficiency of a switched power regulator decreases rapidly with increasing frequency. The critical frequency of a switched power regulator is defined as the frequency at which the switching losses are equal to the other converter losses. Most switched DC-DC converters are conceived to run somewhere around their critical frequency.

As both the power efficiency and the location of the harmonic interferences vary with the switching frequency in SMPS, the most simple and efficient way to achieve the highest possible power conversion efficiency and well-control the harmonic interferences is to use a very accurate and stable switching frequency.

For this purpose, it is possible to use a quartz oscillator. Such an oscillator offers the best performances, but it is very expensive and can not be fully integrated. Moreover, it requires a careful design to guarantee oscillation, and it takes quite a long time for start-up.

It has been also proposed to use a classic RC oscillator using CMOS inverters (see for instance the patent document WO2004/055968). Such an oscillator is low-cost, can be fully integrated and has a quick start-up. It can be realized simply with first and second CMOS ordinary (or plain) inverters mounted in series, one resistor connected to the input and output of the first plain inverter, and one capacitor connected to the input of the first plain inverter and to the output of the second plain inverter. CMOS inverters have virtually infinite input impedance, rail-to-rail output swing capability, extremely low power dissipation, high speed and take very small silicon area. So they are low cost. Unfortunately, the oscillation frequency of such an oscillator is strongly temperature dependent, leading to very poor frequency stability. For a given CMOS process, this temperature dependency of the classic RC oscillator can be reduced to a minimum when the plain inverter is made up of CMOS transistors with certain channel length which is referred as "optimal channel length" hereafter. Unfortunately, the improvement is very limited and the resultant frequency stability is still inadequate over a large temperature range, for example from −40° C. to +120° C.

So, the object of this invention is to offer a new integrated oscillator of the RC type, which offers high frequency stability and accuracy, and which can be used into a SMPS to confer it stable power efficiency and confined harmonic interferences.

For this purpose, it provides an integrated oscillator, for an integrated circuit, comprising:
 first and second compensated inverters mounted in series and each comprising first and second plain inverters mounted in parallel and comprising transistors having channel lengths respectively shorter and longer than the optimal channel length (above mentioned in the case of a classic RC oscillator using plain inverters), the first compensated inverter having input and output terminals respectively connected to first and second nodes and the second compensated inverter having input and output terminals respectively connected to the second node and to a third node, a resistor comprising first and second terminals connected respectively to the first and second nodes, and having a chosen resistance value, a capacitor comprising first and second terminals connected respectively to the first and third nodes, and having a chosen capacitance value to charge and discharge oneself in order to deliver periodically a clock signal at a desired oscillation frequency.

The integrated oscillator according to the invention may include additional characteristics considered separately or combined, and notably:

the desired oscillation frequency may be determined by the chosen resistance value and the chosen capacitance value;

the channel length difference between the first plain inverter and the optimal channel length and/or the channel length difference between the second plain inverter and the optimal channel length may be chosen in order the desired oscillation frequency remains constant over a desired temperature range and possibly over the process spread;

each plain inverter may comprise a pMOS transistor and a nMOS transistor, each having a gate, a source and a drain, the pMOS transistor gate being connected to the first or second node, the pMOS transistor source being connected to the supply voltage, the pMOS transistor drain being connected to the second or third node, the nMOS transistor gate being connected to the pMOS transistor gate, the nMOS transistor source being connected to the ground, and the nMOS transistor drain being connected to the pMOS transistor drain.

Such an integrated oscillator may be used in any integrated circuit (or device or system) to deliver highly stable clock signals, and especially when it needs to be cheap, simple and integrable.

The invention also provides an integrated switched-mode power supply (SMPS) comprising i) an integrated oscillator such as the one above introduced and arranged to deliver a periodical clock signal according to a desired oscillation frequency on an output, and ii) a DC-DC converter comprising a first input intended to be connected to a power supply to be fed with an input DC voltage, a second input connected to the oscillator output, and an output to deliver an output DC voltage having a chosen voltage lower or higher than the input DC voltage.

The invention further provides an electronic equipment comprising a battery arranged to deliver an input DC voltage, an SMPS such as the one above introduced and arranged to convert this input DC voltage into a lower or higher DC voltage, and at least one circuit (or system or else device) to be powered by the lower or higher DC voltage.

Such an electronic equipment may be a battery-powered or portable electronic device such as a mobile (or cellular) phone, a cordless phone, a digital still camera, a MP3 player, or a personal digital assistant (PDA), for instance.

Figure 2:
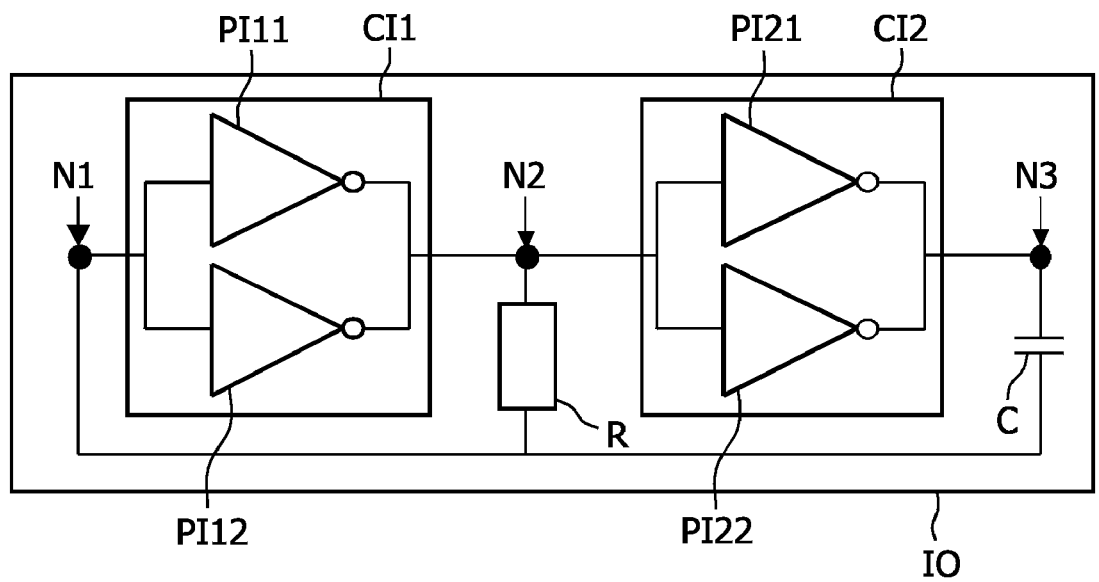
Figure 3:
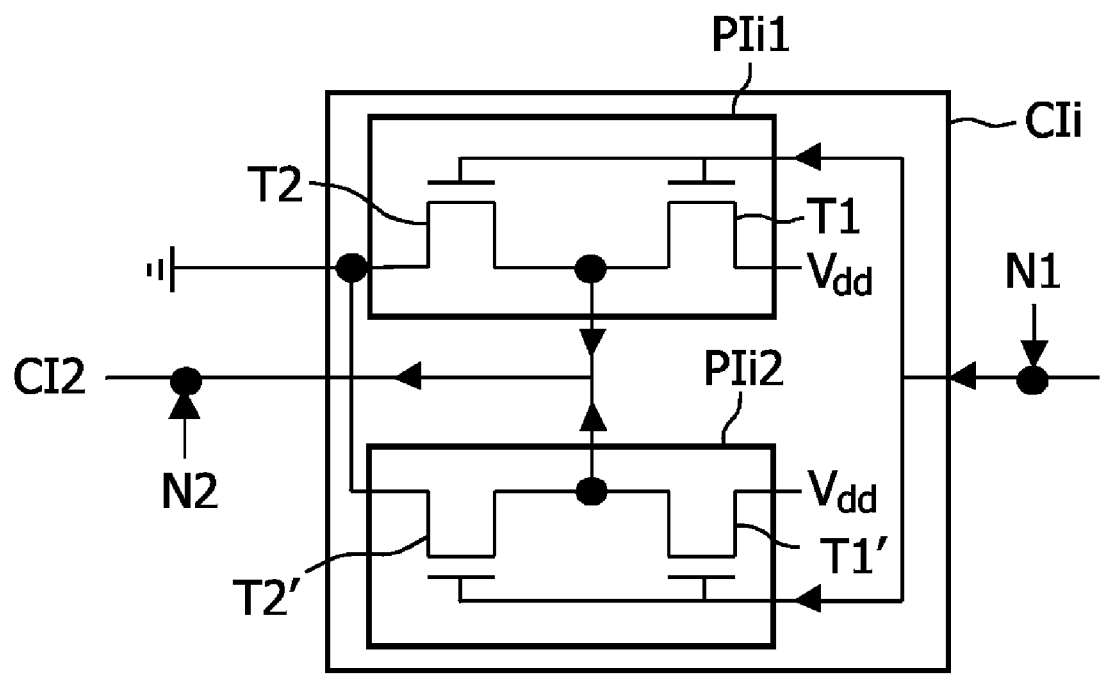

Other features and advantages of the invention will become apparent on examining the detailed specifications hereafter and the appended drawings, wherein:

FIG. 1 schematically illustrates an example of small equipment comprising a SMPS provided with an integrated oscillator according to the invention, FIG. 2 schematically illustrates an example of embodiment of an integrated oscillator according to the invention, and FIG. 3 schematically illustrates an example of embodiment of a compensated inverter of an integrated oscillator according to the invention.

The appended drawings may not only serve to complete the invention, but also to contribute to its definition, if need be.

As mentioned before, the invention provides a new integrated RC oscillator which is intended to be part of an integrated circuit.

In the following description it will be considered that the integrated RC oscillator according to the invention is part of a switched-mode power supply (or SMPS), which itself is part of a battery-powered or portable "small" electronic equipment (or device) such as a mobile (or cellular) phone, a cordless phone, a digital still camera, a MP3 player, or a personal digital assistant (PDA).

But, the invention is not limited to these applications. Indeed, the integrated oscillator may be used in any integrated circuit where high frequency stability and accuracy are mandatory, for instance to confer to a device, that it feeds with periodical clock signals, stable power efficiency and confined harmonic interferences.

As it is schematically illustrated in FIG. 1 a small equipment UE comprises notably a battery BAT, an integrated SMPS IS and a circuit or system CC to power with a chosen DC voltage Vo. For instance, the circuit to power is a digital core of a baseband integrated circuit of a transmission path of a mobile (or cellular) phone.

The integrated SMPS IS comprises an integrated oscillator IO, according to the invention, arranged to output periodical clock signals (having a desired oscillation frequency f0), and a switching power regulator CV. For instance, the switching power regulator CV is a DC-DC switching converter (or buck converter, or else step-down DC-DC converter).

It is recall that a DC-DC switching converter CV comprises at least a PWM (Pulse Width Modulator) controller, two power switches and a LC network (or circuit) in a low-pass filter configuration.

Both power switches are controlled by the PWM controller (possibly through a driver). When the high-side power switch is on, the low-side power switch is off. The battery voltage $V_{BAT}$ is applied to one terminal of the inductor of the LC network, and the current flowing through it is increasing. Then the high-side power switch is turned off and the low-side power switch is turned on, providing a closed loop for the inductor current. The desired output voltage Vo delivered to the load (circuit or system CC) can be changed by adjusting the on-time of the high-side switch. In steady state, the ratio of output voltage Vo to the battery or input voltage is equal to the ratio of the on-time to the period of the switching signal. The capacitor of the LC network filters the high frequency components and reduces the ripple to an acceptable level.

As it is schematically illustrated in FIG. 2, an integrated oscillator IO, according to the invention, comprises first CI1 and second CI2 "compensated" inverters mounted in series, a resistor R and a capacitor C.

Each compensated inverter CIi (i=1 or 2) comprises first PIi1 and second PIi2 plain (or standard or else ordinary) inverters mounted in parallel between two nodes N1 and N2 (CI1) or N2 and N3 (CI2). The first plain inverter PIi1 of each compensated inverter CIi comprises MOS transistors having a channel length shorter than an optimal channel length $L_{opt}$. The second plain inverter PIi2 of each compensated inverter CIi comprises MOS transistors having a channel length longer than the optimal channel length $L_{opt}$.

The resistor R comprises a first terminal connected to the first node N1, i.e. to the input of the first compensated inverter CI1, and a second terminal connected to the second node N2, i.e. to the output of the first compensated inverter CI1.

The capacitor C comprises a first terminal connected to the first node N1, i.e. to the input of the first compensated inverter CI1, and a second terminal connected to the third node N3, i.e. to the output of the second compensated inverter CI2.

The desired oscillation frequency f0 can be obtained by properly adjusting the resistance value and/or the capacitance value.

As it is schematically illustrated in FIG. 3, each plain inverter PIij within each compensated inverter CIi preferably comprises at least first T1 (or T1') and second T2 (or T2') transistors conventionally coupled one to the other.

More precisely, each plain inverter PIij comprises a first transistor T1 (or T1') of the pMOS type and a second transistor T2 (or T2') of the nMOS type, each having a gate, a source and a drain.

The first pMOS transistor T1 (or T1') comprises a gate connected to the first node N1 when it belongs to CI1 (or to the second node N2 when it belongs to CI2), a source connected to a supply node $V_{dd}$, and a drain connected to the second node N2 when it belongs to CI1 (or to the third node N3 when it belongs to CI2).

The second nMOS transistor T2 (or T2') comprises a gate connected to the first pMOS transistor gate (and then to N1 when it belongs to CI1 or to N2 when it belongs to CI2), a source connected to the ground, and a drain connected to the first pMOS transistor drain (and then to N2 when it belongs to CI1 or to N3 when it belongs to CI2).

It will be explained now why it is particularly advantageous to use the above mentioned compensated inverters, mounted in series.

Assuming both plain inverters are identical, one can show that the oscillation frequency f0 of the classic RC oscillator (like the one described here) depends on resistance (R), capacitance (C), and the threshold ($V_{TH}$) of the plain inverter which is defined as $V_{TH}=V_{in}=V_{out}$:

$$f0 = \frac{1}{RC \ln\left(\frac{V_{dd}+V_{TH}}{V_{TH}} \cdot \frac{2V_{dd}-V_{TH}}{V_{dd}-V_{TH}}\right)}$$

with $$V_{TH} = \frac{V_{Tn} + \sqrt{\frac{K_p}{K_n}}(V_{dd}+V_{Tp})}{1+\sqrt{\frac{K_p}{K_n}}}$$

where $V_{dd}$ is the supply voltage, $V_{Tp}$ and $V_{Tn}$ are the respective threshold of the pMOS and nMOS transistors, and $K_p$ and $K_n$ are the respective transconductances of the pMOS and nMOS transistors.

The threshold $V_{TH}$ of each plain inverter PIij depends on the channel lengths L of its pMOS and nMOS transistors, for a given supply voltage $V_{dd}$. For CMOS technology under consideration, the oscillation frequency f0 of a CMOS plain inverter PIij varies very differently with temperature as the channel length L of its MOS transistors varies. For instance, if one considers the PHILIPS's 90 nm CMOS technology, with roughly L<2 μm the oscillation frequency f0 increases with temperature, and the slope gets steeper with shorter channel length L. With roughly L>2 μm, the oscillation frequency f0 decreases with temperature, and the slope gets steeper with longer channel length L. Finally, with L approximately equal to 2 μm, the temperature dependency can be reduced.

In other words, varying channel length L of the MOS transistors alters the threshold $V_{TH}$ of their plain inverter PIij, therefore resulting in different oscillation frequencies f0.

As there exists an optimal temperature stability associated to an optimal channel length $L_{opt}$ for each CMOS technology (for instance $L_{opt}$=2 μm for the PHILIPS's 90 nm CMOS technology), the integrated oscillator could, in theory, comprise only two plain inverters mounted in series and each comprising MOS transistors having an optimal channel length $L_{opt}$.

However, because the variation of the oscillation frequency f0 as a function of the temperature is a curvature rather than a straight line, it is difficult in practice, if not impossible, to achieve a high stable oscillation frequency f0 over a large temperature range, by choosing a channel length approximately equal to the optimal channel length $L_{opt}$.

In some applications, expensive quartz oscillators can be replaced by highly stable RC oscillators like the one described in the present invention. That is the reason why the invention proposes to replace the two plain inverters (mounted in series) with two compensated inverters CIi, each comprising two plain inverters PIij mounted in series and having MOS transistors with channel lengths respectively shorter and longer than the optimal channel length $L_{opt}$ for the considered CMOS technology.

After having determined the theoretical channel length values of the first PIi1 and second PIi2 plain inverters of each compensated inverter CIi, it may be necessary to adjust the channel length difference between the first plain inverter PIi1 of at least one compensated inverter CIi and the optimal channel length $L_{opt}$ and/or the channel length difference between the second plain inverter PIi2 of at least one compensated inverter CIi and the optimal channel length $L_{opt}$.

It is possible to achieve a very high frequency stability over a large temperature range, and possible over process spread, as well, by properly adjusting the said channel length difference. In this way, a frequency stability as high as approximately +/−0.3% over a temperature range from −40° C. to +120° C., and over process spread, can be achieved, which is more than 100 times better than several state-of-the-art integrated oscillators and at least 60 times better than the best currently state-of-the-art integrated oscillators.

Thanks to such high frequency stability over temperature and process spread, it is expected that RC oscillators using compensated inverters according to the invention will be able to replace many quartz oscillators currently in use, and find wide application areas.

The integrated oscillator 10 may be realized not only in CMOS technology, but also in BICMOS technology.

The invention is not limited to the embodiments of integrated oscillator (10), integrated switched-mode power supply (IS) and electronic equipment described above, only as examples, but it encompasses all alternative embodiments which may be considered by one skilled in the art within the scope of the claims hereafter.

The invention claimed is:

1. An integrated oscillator, comprising:
   a first compensated inverter having input and output terminals respectively connected to first and second nodes, the first compensated inverter including a first plain inverter and a second plain inverter coupled in parallel to each other, the first plain inverter having a channel length that is shorter than a channel length of the second plain inverter;

a second compensated inverter having input and output terminals respectively connected to said second node and to a third node, the second compensated inverter including a third plain inverter and a fourth plain inverter coupled in parallel to each other, the third plain inverter having a channel length that is shorter than a channel length of the fourth plain inverter;

a resistor having a resistance value and comprising first and second terminals connected respectively to said first and second nodes; and a capacitor comprising first and second terminals connected respectively to said first and third nodes, and having a capacitance value, the inverters, resistor, and capacitor being configured to deliver a clock signal at the third node at an oscillation frequency.

2. The integrated oscillator according to claim 1, wherein the channel lengths of the first and third plain inverters are shorter than a temperature-stable channel length, and the channel lengths of the second and fourth plain inverters are longer than a temperature-stable channel length, the temperature-stable channel length being a channel length at which the plain inverters would have an oscillation frequency that substantially would not change with temperature.

3. The integrated oscillator according to claim 2, wherein channel length differences between the channel lengths of said plain inverters and said temperature-stable channel length are such to maintain substantially constant the oscillation frequency of the clock signal over a desired temperature range.

4. The integrated oscillator according to claim 3, wherein the channel length differences are chosen such that said oscillation frequency of the clock signal remains constant over a process spread.

5. The integrated oscillator according to claim 1, wherein:
each plain inverter comprises a pMOS transistor and a nMOS transistor, each transistor having a gate, a source and a drain;
the gates of the transistors of the first compensated inverter are connected to said first node;
the gates of the transistors of the second compensated inverter are connected to said second node;
the sources of the pMOS transistors of the first and second compensated inverters are connected to a supply node;
the drains of the transistors of the first compensated inverters are connected to said second node;
the drains of the second compensated inverters are connected to said third node; and
the sources of the nMOS transistors of the first and second compensated inverters are connected to a ground.

6. An integrated switched-mode power supply, comprising:
a DC-DC converter comprising a first input configured to receive an input DC voltage, a second input, and an output configured to deliver an output DC voltage; and
an integrated oscillator configured to deliver a clock signal and an oscillation frequency on an oscillator output that is coupled to the second input of the DC-DC converter, the oscillator including:
a first compensated inverter having input and output terminals respectively connected to first and second nodes, the first compensated inverter including a first plain inverter and a second plain inverter coupled in parallel to each other, the first plain inverter having a channel length that is shorter than a channel length of the second plain inverter;
a second compensated inverter having input and output terminals respectively connected to said second node and to a third node coupled to the oscillator output, the second compensated inverter including a third plain inverter and a fourth plain inverter coupled in parallel to each other, the third plain inverter having a channel length that is shorter than a channel length of the fourth plain inverter;
a resistor having a resistance value and comprising first and second terminals connected respectively to said first and second nodes; and
a capacitor comprising first and second terminals connected respectively to said first and third nodes, and having a capacitance value.

7. An electronic device, comprising:
a battery arranged to deliver an input DC voltage;
an integrated switched-mode power supply arranged to convert said input DC voltage into an output DC voltage, and
a circuit configured to be powered by said output DC voltage, said integrated switched-mode power supply includes:
a DC-DC converter comprising a first input configured to receive the input DC voltage, a second input, and an output configured to deliver the output DC voltage; and
an integrated oscillator configured to deliver a clock signal and an oscillation frequency on an oscillator output that is coupled to the second input of the DC-DC converter, the oscillator including:
a first compensated inverter having input and output terminals respectively connected to first and second nodes, the first compensated inverter including a first plain inverter and a second plain inverter coupled in parallel to each other, the first plain inverter having a channel length that is shorter than a channel length of the second plain inverter;
a second compensated inverter having input and output terminals respectively connected to said second node and to a third node coupled to the oscillator output, the second compensated inverter including a third plain inverter and a fourth plain inverter coupled in parallel to each other, the third plain inverter having a channel length that is shorter than a channel length of the fourth plain inverter;
a resistor having a resistance value and comprising first and second terminals connected respectively to said first and second nodes; and
a capacitor comprising first and second terminals connected respectively to said first and third nodes, and having a capacitance value.

8. Use of the integrated oscillator according to claim 1 to deliver highly stable clock signals.

9. The integrated switched-mode power supply according to claim 6, wherein the channel lengths of the first and third plain inverters are shorter than a temperature-stable channel length, and the channel lengths of the second and fourth plain inverters are longer than a temperature-stable channel length, the temperature-stable channel length being a channel length at which the plain inverters would have an oscillation frequency that substantially would not change with temperature.

10. The integrated switched-mode power supply according to claim 9, wherein channel length differences between the channel lengths of said plain inverters and said temperature-stable channel length are such to maintain substantially constant the oscillation frequency of the clock signal over a desired temperature range.

11. The integrated switched-mode power supply according to claim 10, wherein the channel length differences are chosen such that said oscillation frequency of the clock signal remains constant over a process spread.

12. The integrated switched-mode power supply according to claim 6, wherein:
   each plain inverter comprises a pMOS transistor and a nMOS transistor, each transistor having a gate, a source and a drain;
   the gates of the transistors of the first compensated inverter are connected to said first node;
   the gates of the transistors of the second compensated inverter are connected to said second node;
   the sources of the pMOS transistors of the first and second compensated inverters are connected to a supply node;
   the drains of the transistors of the first compensated inverters are connected to said second node;
   the drains of the second compensated inverters are connected to said third node; and
   the sources of the nMOS transistors of the first and second compensated inverters are connected to a ground.

13. The electronic device according to claim 7, wherein the channel lengths of the first and third plain inverters are shorter than a temperature-stable channel length, and the channel lengths of the second and fourth plain inverters are longer than a temperature-stable channel length, the temperature-stable channel length being a channel length at which the plain inverters would have an oscillation frequency that substantially would not change with temperature.

14. The electronic device according to claim 13, wherein channel length differences between the channel lengths of said plain inverters and said temperature-stable channel length are such to maintain substantially constant the oscillation frequency of the clock signal over a desired temperature range.

15. The electronic device according to claim 14, wherein the channel length differences are chosen such that said oscillation frequency of the clock signal remains constant over a process spread.

16. The electronic device according to claim 7, wherein:
   each plain inverter comprises a pMOS transistor and a nMOS transistor, each transistor having a gate, a source and a drain;
   the gates of the transistors of the first compensated inverter are connected to said first node;
   the gates of the transistors of the second compensated inverter are connected to said second node;
   the sources of the pMOS transistors of the first and second compensated inverters are connected to a supply node;
   the drains of the transistors of the first compensated inverters are connected to said second node;
   the drains of the second compensated inverters are connected to said third node; and
   the sources of the nMOS transistors of the first and second compensated inverters are connected to a ground.

* * * * *